(12) United States Patent
Kato et al.

(10) Patent No.: US 9,742,304 B2
(45) Date of Patent: Aug. 22, 2017

(54) DRIVER BOARD AND POWER CONVERTER

(71) Applicant: Hitachi Automotive Systems, Ltd., Hitachinaka-shi, Ibaraki (JP)

(72) Inventors: Takeshi Kato, Hitachinaka (JP); Masashige Tsuji, Hitachinaka (JP); Satoshi Hiranuma, Hitachinaka (JP)

(73) Assignee: Hitachi Automotive Systems, Ltd., Hitachinaka-shi (JP)

(*) Notice: Subject to any disclaimer, the term of this patent is extended or adjusted under 35 U.S.C. 154(b) by 0 days.

(21) Appl. No.: 15/026,516

(22) PCT Filed: Oct. 1, 2014

(86) PCT No.: PCT/JP2014/076242
§ 371 (c)(1),
(2) Date: Mar. 31, 2016

(87) PCT Pub. No.: WO2015/053142
PCT Pub. Date: Apr. 16, 2015

(65) Prior Publication Data
US 2016/0226392 A1    Aug. 4, 2016

(30) Foreign Application Priority Data
Oct. 9, 2013    (JP) .................................. 2013-211800

(51) Int. Cl.
*H02M 1/08*    (2006.01)
*H02M 5/458*    (2006.01)
(Continued)

(52) U.S. Cl.
CPC ............ *H02M 5/458* (2013.01); *H02M 1/08* (2013.01); *H02M 7/003* (2013.01); *H03K 17/61* (2013.01); *H03K 2217/0081* (2013.01)

(58) Field of Classification Search
CPC    H02M 7/003; H02M 1/08; H03K 2217/0081; H03K 17/605; H03K 17/61; H03K 17/689; H03K 17/691
See application file for complete search history.

(56) References Cited

U.S. PATENT DOCUMENTS 6,388,889 B1    5/2002    Oka
6,970,367 B2    11/2005   Takeshima et al.
(Continued)

FOREIGN PATENT DOCUMENTS

JP    62-158880        10/1987
JP    10-98887 A        4/1998
(Continued)

OTHER PUBLICATIONS

International Search Report (PCT/ISA/210) issued in PCT Application No. PCT/JP2014/076242 dated Jan. 6, 2015 with English translation (5 pages).
(Continued)

*Primary Examiner* — Harry Behm
(74) *Attorney, Agent, or Firm* — Crowell & Moring LLP

(57) ABSTRACT

Provided is a driver board capable of miniaturizing itself while ensuring insulation voltage resistance performance. In the driver board: a transformer 114 is configured, so as to cross a first insulating region 120a, such that a primary side terminal 114a is connected to a primary side circuit 112a and a secondary side terminal 114b is connected to a secondary side circuit 113a; a power supply control IC 115 is configured, so as to cross a insulating region 120b, such that a primary side terminal 115a is connected to a primary side circuit 112b and a secondary side terminal 115b is connected to a secondary side circuit 113b; and the insulating region 120a and the insulating region 120b are formed so as to at least partially face each other via an insulating board 111 such that the primary side circuit 112a and the secondary (Continued)

side circuit 113b do not face each other via the insulating board and the primary side circuit 112b and the secondary side circuit 113a do not face each other via the insulating board.

12 Claims, 14 Drawing Sheets

(51) Int. Cl.
*H02M 7/00* (2006.01)
*H03K 17/61* (2006.01)

(56) References Cited

U.S. PATENT DOCUMENTS

| | | | | |
|---|---|---|---|---|
| 2001/0040812 | A1* | 11/2001 | Jitaru | H01F 27/06 363/21.06 |
| 2003/0133257 | A1* | 7/2003 | Beihoff | B60L 11/12 361/600 |
| 2005/0052888 | A1* | 3/2005 | Takeshima | H02M 7/003 363/147 |
| 2009/0174353 | A1* | 7/2009 | Nakamura | B60L 11/1868 318/400.27 |
| 2009/0243764 | A1* | 10/2009 | Hauenstein | H01L 25/16 333/24 C |
| 2011/0024163 | A1 | 2/2011 | Goto et al. | |
| 2011/0221268 | A1 | 9/2011 | Kanazawa et al. | |
| 2014/0092653 | A1* | 4/2014 | Suzuki | H02M 1/08 363/55 |
| 2017/0012551 | A1* | 1/2017 | Kondo | H02M 1/08 |

FOREIGN PATENT DOCUMENTS

| | | |
|---|---|---|
| JP | 10-199736 A | 7/1998 |
| JP | 2000-269667 A | 9/2000 |
| JP | 2001-250890 A | 9/2001 |
| JP | 2008-118815 A | 5/2008 |
| JP | 2010-104135 A | 5/2010 |

OTHER PUBLICATIONS

Japanese-language Written Opinion (PCT/ISA237) issued in PCT Application No. PCT/JP2014/076242 dated Jan. 6, 2015 (3 pages).
European Search Report issued in counterpart European Application No. 14852693.2 dated Apr. 25, 2017 (nine pages).

* cited by examiner

DRIVER BOARD AND POWER CONVERTER

TECHNICAL FIELD

The present invention relates to a driver board on which a driver circuit that drives a switching element is mounted, and to a power converter provided with the driver board.

BACKGROUND ART

A three-phase inverter has, in each phase, a semiconductor switching element for an upper arm and a semiconductor switching element for a lower arm, and each semiconductor switching element includes a driver circuit for driving the semiconductor switching element (for example, refer to PTL 1). Control power is supplied from a multi-output transformer to each driver circuit. The driver circuit and the transformer are mounted on an insulating board, whereby a driver board is configured.

CITATION LIST

Patent Literature

PTL 1: Publication of Patent Application No. 2008-118815

SUMMARY OF INVENTION

Technical Problem

Since a control terminal of a semiconductor switching element is connected to a driver circuit, voltage of the driver circuit varies at every switching of the semiconductor switching element. Therefore, a photocoupler or the like is used in a signal line between a control circuit that outputs a control command to the driver circuit and the driver circuit in order to ensure electrical insulation. In this way, circuit components having different levels of potential coexist in the driver board, and insulating regions prepared in consideration of insulation voltage resistance performance are provided between these components. Therefore, the driver board tends to increase in size. Since the increase in the size of the driver board causes an inverter to become larger, there has been a demand for miniaturizing the driver board while ensuring the insulation voltage resistance performance.

Solution to Problem

An invention of claim 1 is a driver board on which a driver circuit that drives a switching element of a power converter is mounted, the driver board including: an insulating board formed in a flat plate shape; a transformer that converts an input primary side voltage to a secondary side voltage for driving the switching element; a power supply control IC that controls a current input to the transformer; a primary side circuit that is mounted on each of a first circuit region and a second circuit region and uses the primary side voltage as a power supply, the first circuit region being on one surface of the insulating board, the second circuit region being provided on another surface of the insulating board and facing the first circuit region via the insulating board; a secondary side circuit that is mounted on each of a third circuit region and a fourth circuit region, includes the driver circuit, and uses the secondary side voltage as a power supply, the third circuit region being adjacent to the first circuit region via a first insulating region on the one surface, the fourth circuit region being adjacent to the second circuit region via a second insulating region on the other surface; a first through hole that penetrates the insulating board and electrically connects the primary side circuit on the first circuit region to the primary side circuit on the second circuit region; and a second through hole that penetrates the insulating board and electrically connects the secondary side circuit on the third circuit region to the secondary side circuit on the fourth circuit region, wherein the transformer is configured, so as to cross the first insulating region, such that a primary side terminal is connected to the primary side circuit provided on the first circuit region and a secondary side terminal is connected to the secondary side circuit provided on the third circuit region, the power supply control IC is configured, so as to cross the second insulating region, such that a primary side terminal is connected to the primary side circuit provided on the second circuit region and a secondary side terminal is connected to the secondary side circuit provided on the fourth circuit region, and the first insulating region and the second insulating region are formed so as to at least partially face each other via the insulating board such that the first circuit region and the fourth circuit region do not face each other via the insulating board and the second circuit region and the third circuit region do not face each other via the insulating board.

Advantageous Effects of Invention

According to the present invention, it is possible to miniaturize a driver board while ensuring insulation voltage resistance performance.

DESCRIPTION OF EMBODIMENTS

Hereinafter, embodiments for practicing the present invention will be described with reference to the drawings.

Figure 1:
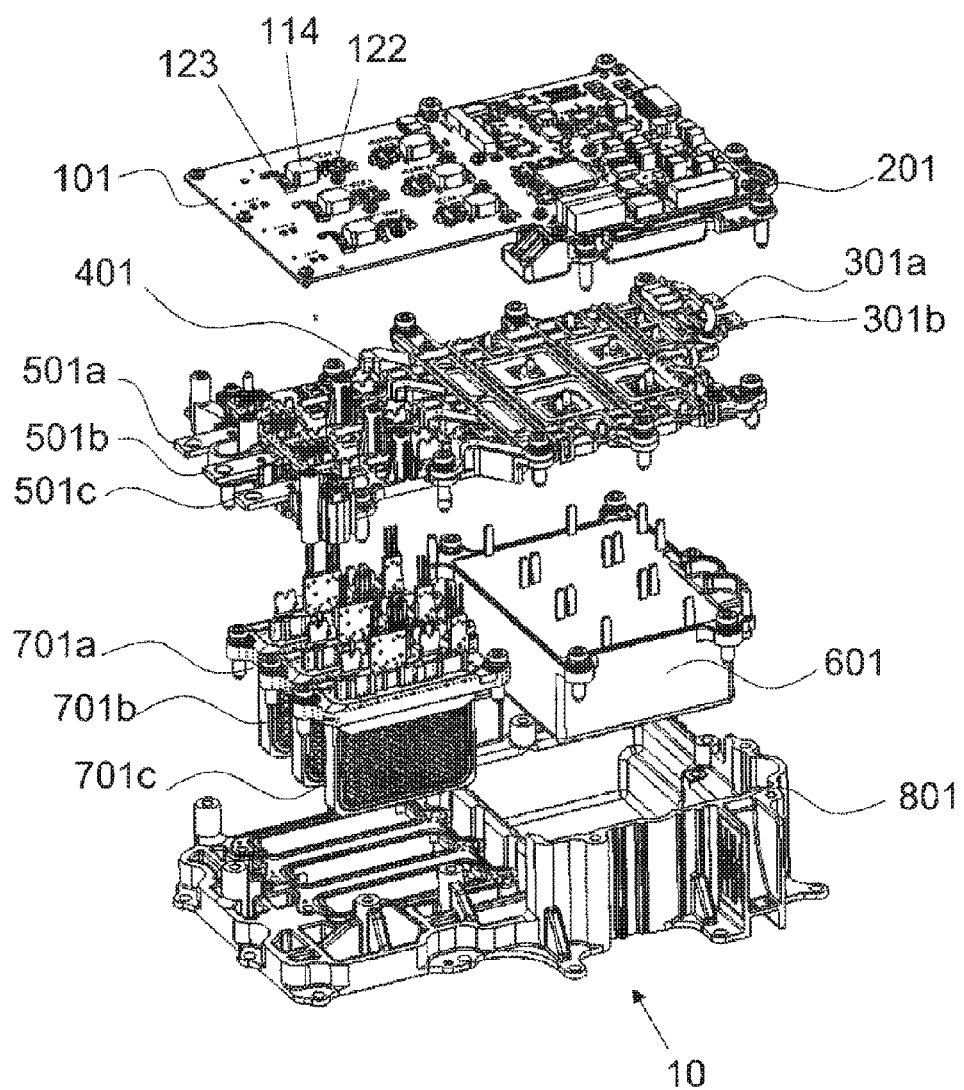
FIG. 1 is an exploded perspective view illustrating an overall configuration of an inverter.

FIG. 1 is a view illustrating an exemplary power converter, and an exploded perspective view illustrating an overall configuration of an inverter that drives a rotary electric machine. The inverter 10 includes, for example, three semiconductor modules 701a, 701b, 701c, a capacitor for smoothing 601, a bus bar module 400, a driver board 101, and a cooling case 801. The three semiconductor modules 701a, 701b, 701c correspond to three phases including a U phase, a V phase, and a W phase. A housing that covers side surfaces and an upper surface of the inverter is attached to the cooling case 801. An illustration of the housing is omitted from FIG. 1.

Each semiconductor module 701a, 701b, 701c includes a pair of semiconductor switching elements connected in series as described later. Positive and negative input terminals, an output terminal, and a plurality of control terminals are provided in each semiconductor module 701a, 701b, 701c so as to project over a module case. An upper surface of the capacitor 601 is also provided with a plurality of positive terminals and a plurality of negative terminals.

The bus bar module 400 includes a positive input bus bar 301a, a positive input bus bar 301b, a U phase output bus bar 501a, a V phase output bus bar 501b, a W phase output bus bar 501c, and an insulating structure 401 that holds these bus bars. The positive input terminal of each semiconductor module 701a, 701b, 701c is connected to the positive input bus bar 301a, and the negative input terminal of each semiconductor module 701a, 701b, 701c is connected to the negative input bus bar 301b. The output terminal of the semiconductor module 701a is connected to the U phase output bus bar 501a. The output terminal of the semiconductor module 701b is connected to the V phase output bus bar 501b. The output terminal of the semiconductor module 701c is connected to the W phase output bus bar 501c. The insulating structure 401 has a function to hold the bus bars 301a, 301b, 501a to 501c and a function to maintain insulation between them.

Electronic components are mounted on both front and back surfaces of the driver board 101. Elements constituting a control circuit are mounted on a right side of the driver board 101 in the drawing. On a left side of the driver board 101 in the drawing, elements constituting a driver circuit for driving the semiconductor switching elements provided in the semiconductor modules 701a, 701b, 701c are mounted. A secondary side circuit element 122 including the driver circuit is mounted on one side of the transformer 114, and a primary side circuit element 123 is mounted on the other side of the transformer 114. The driver board 101 is held by a board fixing structure 201 attached to the insulating structure 401.

In the example illustrated in FIG. 1, the elements on the driver circuit side and the elements on the control circuit side are mounted on the same board (driver board 101). However, the present invention can be applied to even a configuration to mount each of them on an individual board. The present embodiment is characterized by an arrangement of the transformer 114, a power supply control IC therefor (to be described later), the primary side circuit 112, and the secondary side circuit 113.

Figure 2:
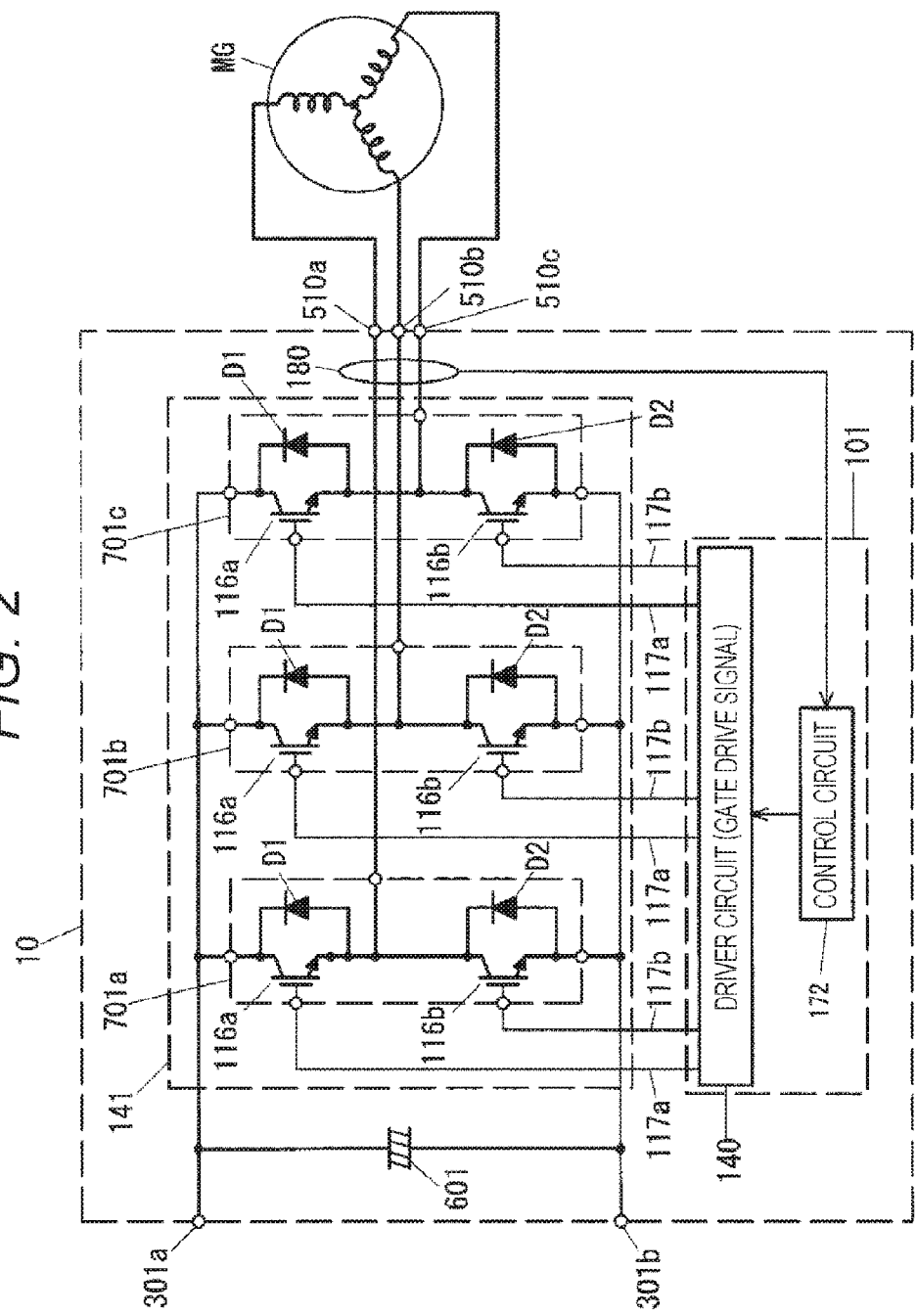
FIG. 2 is a diagram illustrating a circuit configuration of the inverter.

FIG. 2 is a diagram illustrating a circuit configuration of the inverter 10. The semiconductor switching elements 116a, 116b provided in each semiconductor module 701a, 701b, 701c constitute an upper and lower arms serial circuit. The respective upper and lower arms serial circuits are connected in parallel between the positive input bus bar 301a and the negative input bus bar 301b, whereby a three-phase bridge circuit is configured as an inverter circuit 141. The semiconductor switching elements 116a, 116b are respectively provided with circulating diodes D1, D2.

The U phase output bus bar 510a is connected to a midpoint part of the upper and lower arms serial circuit of the semiconductor module 701a for the U phase. The V phase output bus bar 510b is connected to a midpoint part of the upper and lower arms serial circuit of the semiconductor module 701b for the V phase. The W phase output bus bar 510c is connected to a midpoint part of the upper and lower arms serial circuit of the semiconductor module 701c for the W phase. A current flowing through each output bus bar 510a to 510c is detected by a current sensor 180, and a detection signal of the current sensor 180 is input to the control circuit 172. The output bus bars 510a to 510c are respectively connected to a U phase terminal, a V phase terminal, and a W phase terminal of the rotary electric machine MG. The example illustrated in FIG. 2 depicts a case where current values for the three phases are detected. However, a configuration to detect current values for two phases may also be employed.

The control terminals of the above-mentioned semiconductor modules 701a, 701b, 701c include gate control terminals 117a, 117b. Gate drive signals are input from the driver circuit 140 to the respective semiconductor switching elements 116a, 116b via these gate control terminals 117a, 117b, whereby on/off control is performed for the respective semiconductor switching elements 116a, 116b. The driver circuit 140 outputs the gate drive signal based on a control signal from the control circuit 172.

Figure 3:
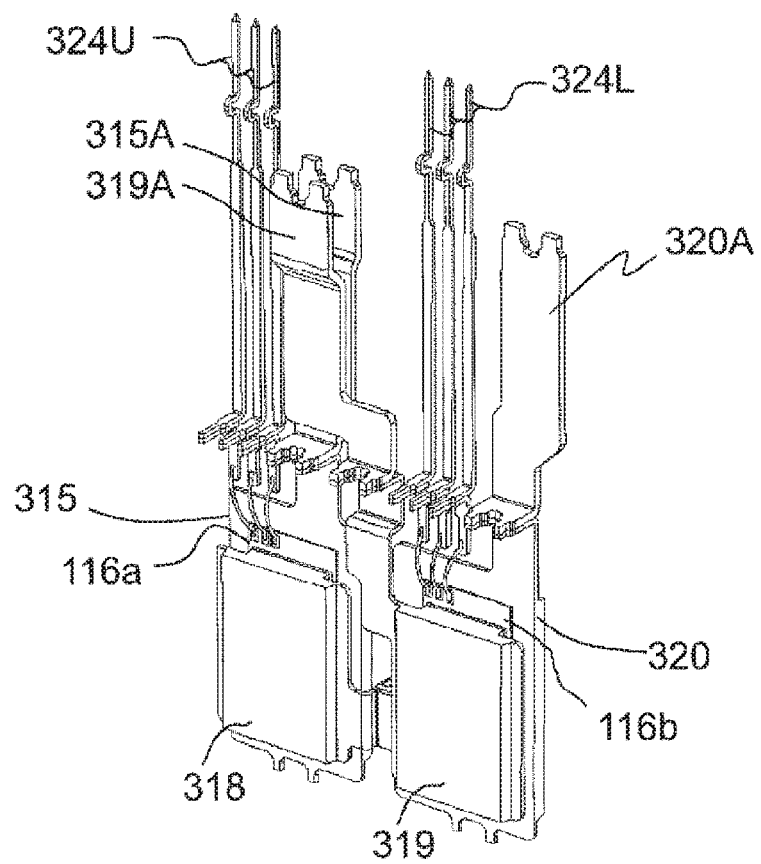
FIG. 3 is a view describing a power module.

FIG. 3 is a view illustrating an internal configuration of a power module 701a to 701c. All the power modules 701a to 701c have the same configuration. The semiconductor switching elements 116a, 116b and the diodes D1, D2 each have a plate-shaped flat structure. The respective electrodes of the semiconductor switching elements 116a, 116b and the diodes D1, D2 are formed on front and back surfaces. A collector electrode of the semiconductor switching element 116a on the upper arm side and a cathode electrode of the diode D1 (not illustrated) on the upper arm side are connected to a conductor plate 315. On the other hand, a collector electrode of the semiconductor switching element 116b on the lower arm side and a cathode electrode of the diode D2 (not illustrated) on the lower arm side are connected to a conductor plate 320.

A conductor plate 318 is arranged on the semiconductor switching element 116a and the diode D1, and an emitter electrode of the semiconductor switching element 116a and an anode electrode of the diode D1 are connected to the conductor plate 318. A conductor plate 319 is arranged on the semiconductor switching element 116b and the diode D2, and an emitter electrode of the semiconductor switching element 116b and an anode electrode of the diode D2 are connected to the conductor plate 319. The conductor plate 320 and the conductor plate 318 are connected via an intermediate electrode, whereby the upper and lower arms serial circuit is formed.

The positive input terminal 315A is connected to the conductor plate 315. The negative input terminal 319A is connected to the conductor plate 319. The output terminal 320A is connected to the conductor plate 320. The plurality of control terminals 324U is connected to the semiconductor switching element 116a. Similarly, the plurality of control terminals 324L is connected to the semiconductor switching element 116b.

As illustrated in FIG. 2, six semiconductor switching elements 116a, 116b in total of the three phases including the U, V, and W phases are provided in the inverter. The transformer 114, the primary side circuit, and the secondary side circuit or the like are provided for each of the semiconductor switching elements 116a, 116b on the driver board 101.

Figure 4:
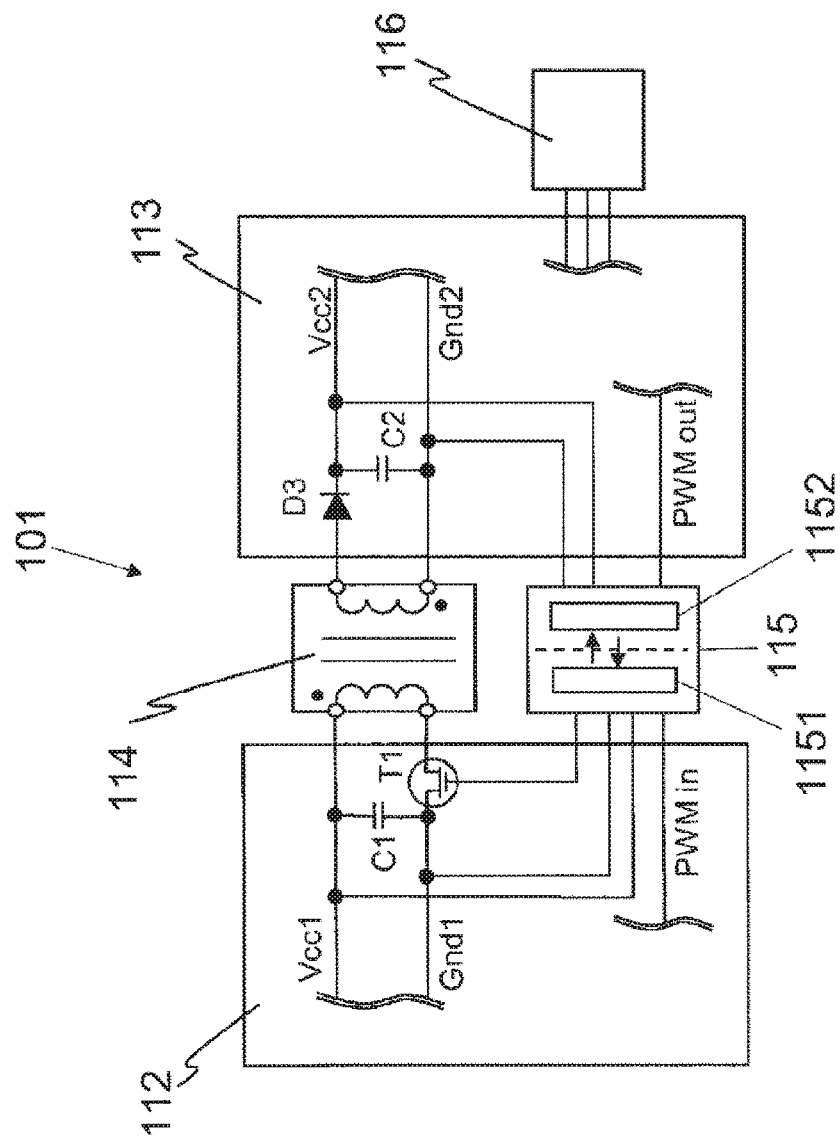
FIG. 4 is a circuit block diagram illustrating a configuration of a driver board 101.

FIG. 4 is a circuit block diagram illustrating a configuration of the driver board 101. In FIG. 4, a circuit configuration of one of the six semiconductor switching elements in total of the upper and lower arms is illustrated. A similar circuit is provided for each of the semiconductor switching elements. In this description, the semiconductor switching elements 116a, 116b are represented by reference sign 116. Hereinafter, characteristics of the driver board 101 will be described using a circuit for driving the semiconductor switching element 116 for a single arm as an example.

The driver board 101 includes the transformer 114, the power supply control IC 115, the primary side circuit 112, and the secondary side circuit 113. A flyback power supply circuit is configured in the example illustrated in FIG. 4, and the semiconductor switching element 116 is connected to the secondary side circuit. However, possible applications of the present invention are not limited to the flyback.

The transformer 114 has a primary side winding and a secondary side winding insulated from each other. A positive potential side of a primary side input voltage is connected to an input side of the primary side winding, and a ground potential side Gnd1 of the primary side input voltage is connected to an output side of the primary side winding via a semiconductor switch T1. A smoothing capacitor C1 is connected in parallel to the primary side winding. The semiconductor switch T1 for turning the primary side input voltage Vcc1 applied to the transformer 114 on and off (conductive and non-conductive) is connected to the output side of the primary side winding. The semiconductor switch T1 is turned on and off under the control of the power supply control IC 115, whereby a current input to the transformer 114 is controlled. The semiconductor switch T1 is configured such that a collector is connected to the output side of the primary side winding, an emitter is connected to the ground potential side Gnd1 of the primary side input voltage, and a base is connected to the power supply control IC 115. The semiconductor switch T1 may be incorporated in the power supply control IC 115.

A rectifier diode D3 is connected to an output side of the secondary side winding of the transformer 114, and a cathode of the rectifier diode D3 is connected to a positive potential side Vcc2 of a secondary side voltage. An input side of the secondary side winding is connected to a ground potential side Gnd2 of the secondary side voltage. A smoothing capacitor C2 is connected in parallel to the secondary side winding. The transformer 114 outputs a voltage insulated from the primary side circuit 112 to the secondary side of the transformer 114 by means of the switch operation for the semiconductor switch T1 and mutual induction in the transformer 114.

A primary side semiconductor circuit 1151 and a secondary side semiconductor circuit 1152 insulated and separated from each other are provided inside of the power supply control IC 115. A photocoupler is incorporated in the power supply control IC 115, whereby a signal is transmitted between the primary side and the secondary side. The primary side input voltage is input to the power supply control IC 115 as a power supply for operation.

The power supply control IC 115 inputs a control signal for controlling the switching to the base of the semiconductor switch T1. The power supply control IC 115 is further connected to the positive potential side Vcc2 and the ground potential side Gnd2 of the secondary side voltage for detecting an output voltage on the secondary side. The power supply control IC 115 detects the output voltage on the secondary side and performs feedback control for the switch operation for the semiconductor switch T1 such that the output voltage reaches a target voltage.

A low-voltage power supply voltage circuit (potential is Vcc1, Gnd1) and a PWM signal generation circuit are provided on the primary side circuit 112 although they are not illustrated in FIG. 4. A PWM signal from the PWM signal generation circuit is transmitted to the secondary side via the power supply control IC 115. In FIG. 4, PWMin is a PWM signal on the primary side input to the power supply control IC 115, and PWMout is a PWM signal on the secondary side output from the power supply control IC 115. A circuit for transmitting the PWM signal from the primary side to the secondary side is provided inside of the power supply control IC 115.

The secondary side circuit 113 is a circuit operated by a voltage power supply output from the secondary side of the transformer 114, and includes the driver circuit that drives the semiconductor switching element 116 in response to the PWM signal (PWMout). For example, the primary side voltage is about 12 V while the secondary side voltage is about 420 V, which is higher than the voltage on the primary side.

Figure 5:
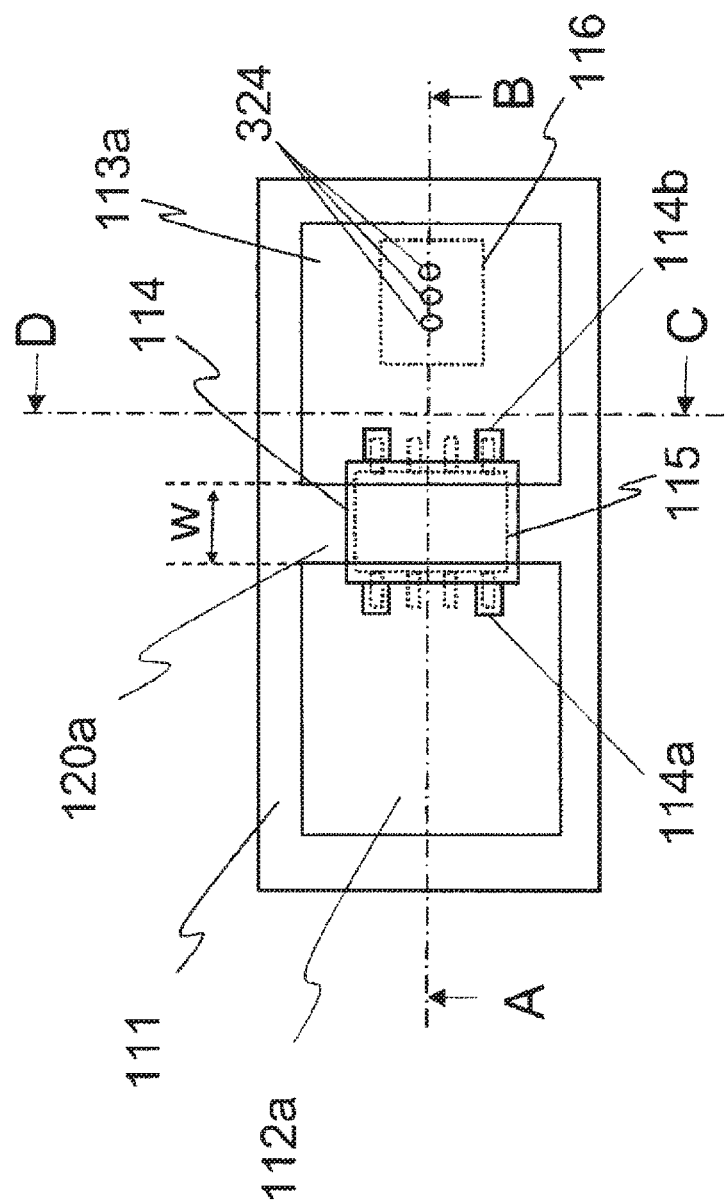
FIG. 5 is a plan view of a part of the driver board 101 on which a transformer 114, a primary side circuit 112, and a secondary side circuit 113 are provided.
Figure 6:
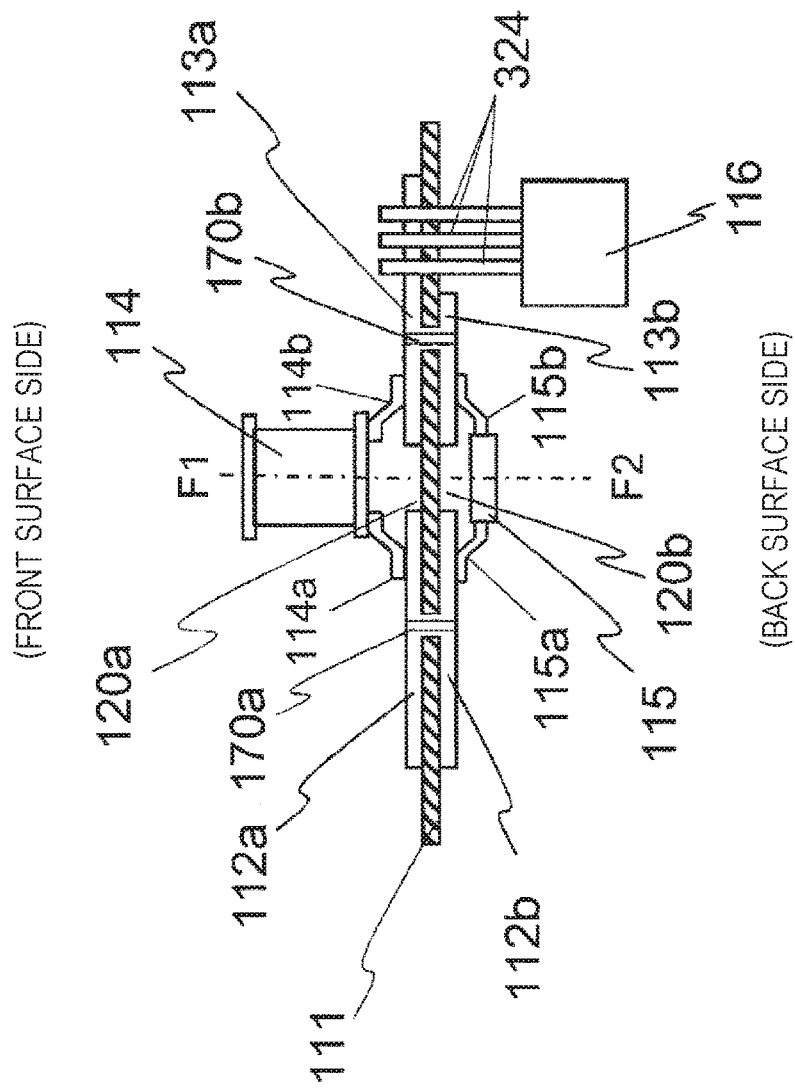
FIG. 6 is a cross-sectional view taken along line A-B of FIG. 5.
Figure 7:
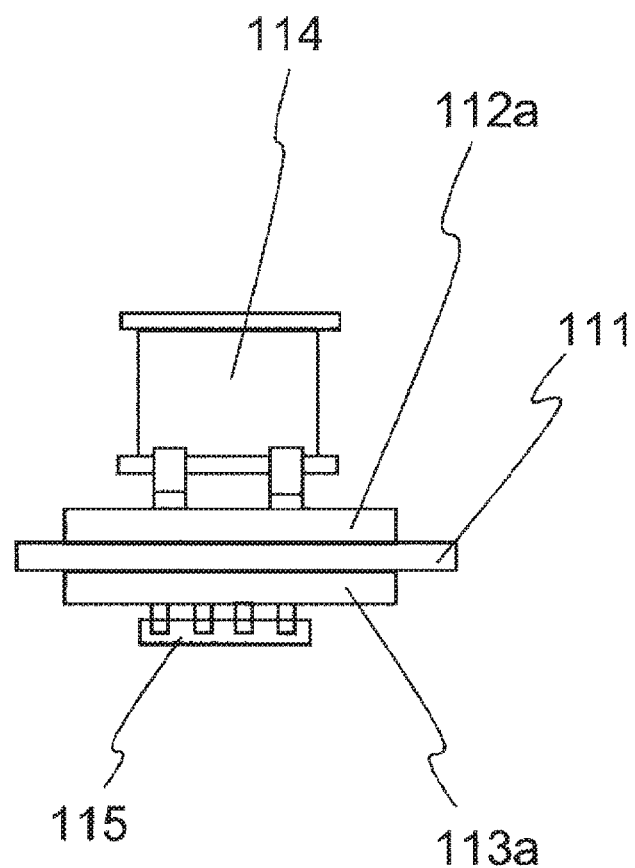
FIG. 7 is a cross-sectional view taken along line C-D of FIG. 5.

FIG. 5 is a plan view of a part of the driver board 101 on which the transformer 114, the primary side circuit 112, and the secondary side circuit 113 are provided. FIG. 6 is a cross-sectional view taken along line A-B of FIG. 5, and FIG. 7 is a cross-sectional view taken along line C-D of FIG. 5. The driver board 101 includes the primary side circuit 112 and the secondary side circuit 113 arranged on both front and back surfaces of an insulating board 111 formed in a flat plate shape, the transformer 114 arranged on the front surface side, and the power supply control IC 115 (represented by a broken line) formed on the back surface side.

The plurality of circuit elements such as the semiconductor switch T1 and the smoothing capacitor C1 illustrated in FIG. 4 is provided on the primary side circuit 112, and they are connected by a wiring pattern formed on the insulating board 111. Similarly, the circuit elements such as the driver circuit and a wiring pattern that connects them are provided on the secondary side circuit 113.

The primary side circuit 112 and the secondary side circuit 113 are provided on both the front and back surfaces of the insulating board 111. Reference sign 112a represents an arrangement region of the primary side circuit provided on the front surface side, reference sign 112b represents an arrangement region of the primary side circuit provided on the back surface side, reference sign 113a represents an arrangement region of the secondary side circuit provided on the front surface side, and reference sign 113b represents an arrangement region of the secondary side circuit provided on the back surface side. A region on the insulating board 111 outside each arrangement region forms an insulating region on which a circuit element or a wiring pattern is not provided.

In the present embodiment, the term primary side circuit 112a is used to represent all of the circuit elements constituting the primary side circuit and the wiring pattern arranged on the region denoted by reference sign 112a, and also to represent the region on which the primary side circuit is provided (rectangular region illustrated in FIG. 5).

FIG. 5 is a plan view illustrating the front surface side of the insulating board 111, and the insulating region 120a is provided between the primary side circuit 112a and the secondary side circuit 113a provided on the front surface side. The transformer 114 is arranged so as to cross the insulating region 120a. A primary side terminal 114a is connected to the wiring pattern of the primary side circuit 112a, and a secondary side terminal 114b is connected to the wiring pattern of the secondary side circuit 113a.

As illustrated in FIGS. 6 and 7, on the back surface side of the insulating board 111, the primary side circuit 112b and the secondary side circuit 113b are arranged adjacent to each other via the insulating region 120b. In FIG. 6, the wiring patterns are illustrated as examples of the primary side circuits 112a, 112b and the secondary side circuits 113a, 113b. The wiring pattern of the primary side circuit 112a on the front surface side is connected to the wiring pattern of the primary side circuit 112b on the back surface side by a through hole 170a. Similarly, the wiring pattern of the secondary side circuit 113a on the front surface side is connected to the wiring pattern of the secondary side circuit 113b on the back surface side by a through hole 170b. The through holes 170a, 170b are each conductive through hole wiring penetrating the insulating board 111. A plurality of the through holes 170a, 170b is arranged to electrically connect the wiring patterns on the front surface side to the wiring patterns on the back surface side.

The power supply control IC 115 provided on the back surface side is arranged so as to cross the insulating region 120b. A primary side terminal 115a is connected to the wiring pattern of the primary side circuit 112b, and a secondary side terminal 115b is connected to the wiring pattern of the secondary side circuit 113b. The semiconductor switching element 116 is arranged on the back surface side with respect to the driver board 101 (refer to FIG. 4). The control terminals 324 of the semiconductor switching element 116 penetrate the insulating board 111 from the back surface side to the front surface side and are connected to the wiring pattern of the secondary side circuit 113a provided on the front surface side.

As mentioned above, the control terminals 324 of the semiconductor switching element 116 are connected to the secondary side circuit 113. Generally, Vcc1 is set to CD 12 V, and Vcc2 is set to DC 15 V. A potential difference between Vcc1 and Vcc2 insulated from each other is equal to or greater than a power supply voltage (420 V) of the semiconductor switching element 116. Therefore, an insulation distance between the primary side circuit 112a and the secondary side circuit 113a, namely a width W of the insulating region 120a is set so as to satisfy predetermined insulation voltage resistance performance that depends on the potential difference. The primary side circuit 112b and the secondary side circuit 113b on the back surface side are also configured similarly. In this example, since the potential difference between the primary side circuit 112b and the secondary side circuit 113b is the same as the potential difference between the primary side circuit 112a and the secondary side circuit 113a, a width of the insulating region 120b is set to be the same as the width W of the insulating region 120a. In addition, the transformer 114 is arranged so as to cross the insulating region 120a, and the power supply control IC 115 is arranged so as to cross the insulating region 120b.

As mentioned above, in the present embodiment, the transformer 114 and the power supply control IC 115 are respectively arranged on the front surface side and the back surface side so as to cross the insulating regions, and the primary side circuit 112 and the secondary side circuit 113 are separately arranged on both the front and back surfaces of the insulating board 111, whereby the wiring from the transformer 114 and the power supply control IC 115 to the secondary side circuit can be minimized. The driver board 101 can therefore be miniaturized.

In this case, the insulating region 120a and the insulating region 120b are formed so as to at least partially face each other via the insulating board 111 such that the primary side circuit 112a and the secondary side circuit 113a do not face each other via the insulating board 111 and the primary side circuit 112b and the secondary side circuit 113b do not face each other via the insulating board 111. Therefore, it is possible to prevent the reduction in the insulation voltage resistance performance. In particular, as illustrated in FIG. 6, the insulating region 120a and the insulating region 120b are preferably arranged such that a central position F1 in a width direction of the insulating region 120a and a central position F2 in a width direction of the insulating region 120b face each other via the insulating board 111. Owing to this arrangement, the primary side circuit and the secondary side circuit on the front and back surfaces can be arranged farthest from each other, whereby voltage resistance performance between the front and back surfaces via the insulating board 111 can be improved.

Figure 8:
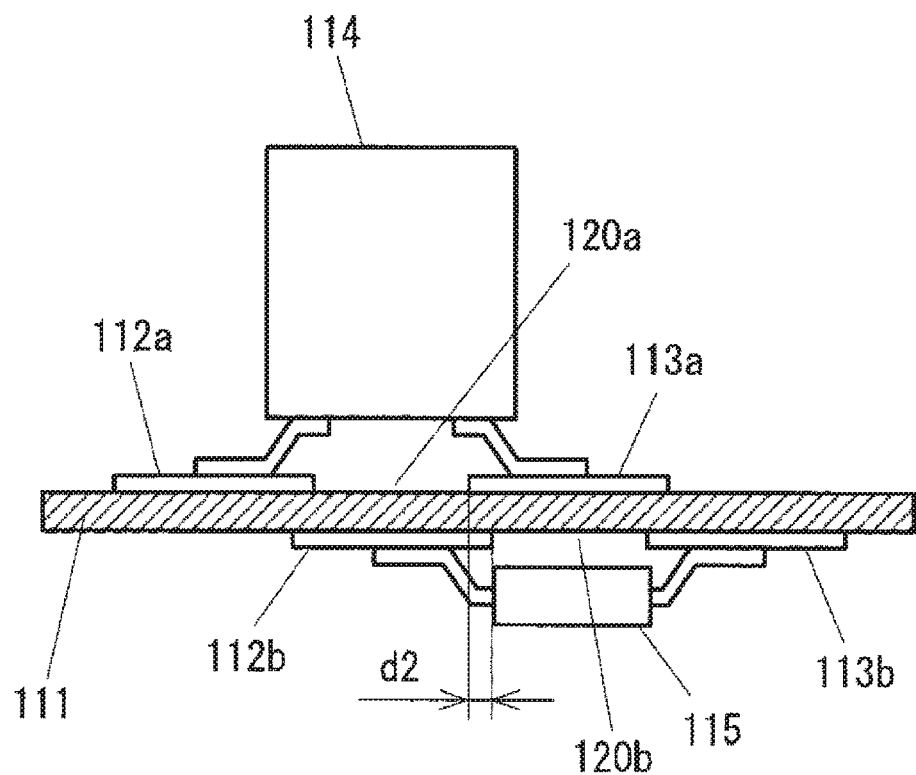
FIG. 8 is a view illustrating an exemplary case where a center of an insulating region 120a and a center of an insulating region 120b do not face each other.

FIG. 8 is a view illustrating a comparative example. In FIG. 8, the primary side circuit 112b on the back surface side and the secondary side circuit 113b on the front surface side partially (at a part represented by a dimension d2) face each other via the insulating board 111. This arrangement causes the secondary side circuit 113a on the front surface side and the primary side circuit 112b on the back surface side to come closer to each other, whereby the insulation voltage resistance performance is reduced due to intrusion of noise (noise accompanying the switching of the semiconductor switching element 116) generated in the secondary side circuit 113a into the primary side circuit 112b or an insufficient insulation distance. In addition, as can be seen from FIG. 8, the insulating board 111 needs to have a larger area than that illustrated in FIG. 6, thereby hindering the miniaturization of a device.

Figure 9:
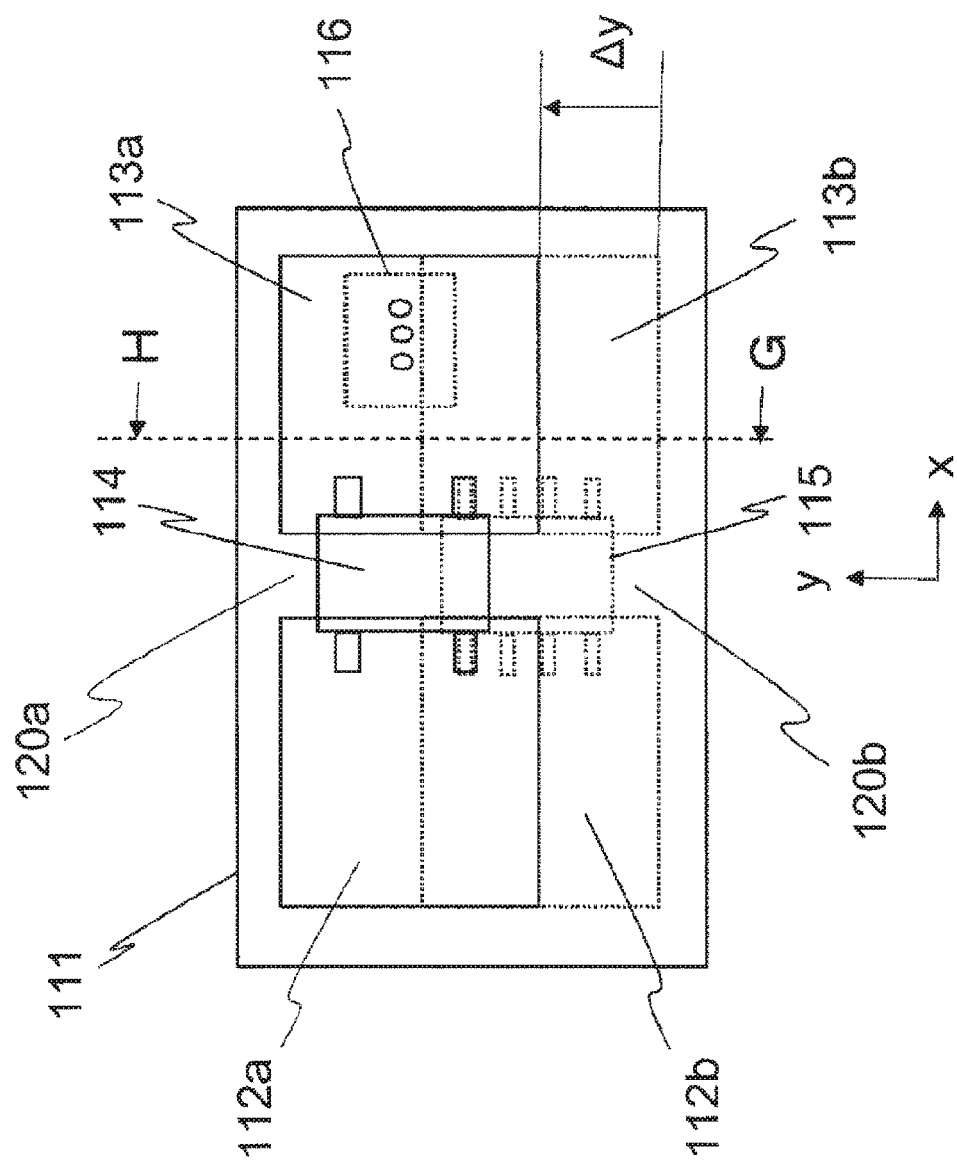
FIG. 9 is a plan view illustrating another exemplary arrangement.
Figure 10:
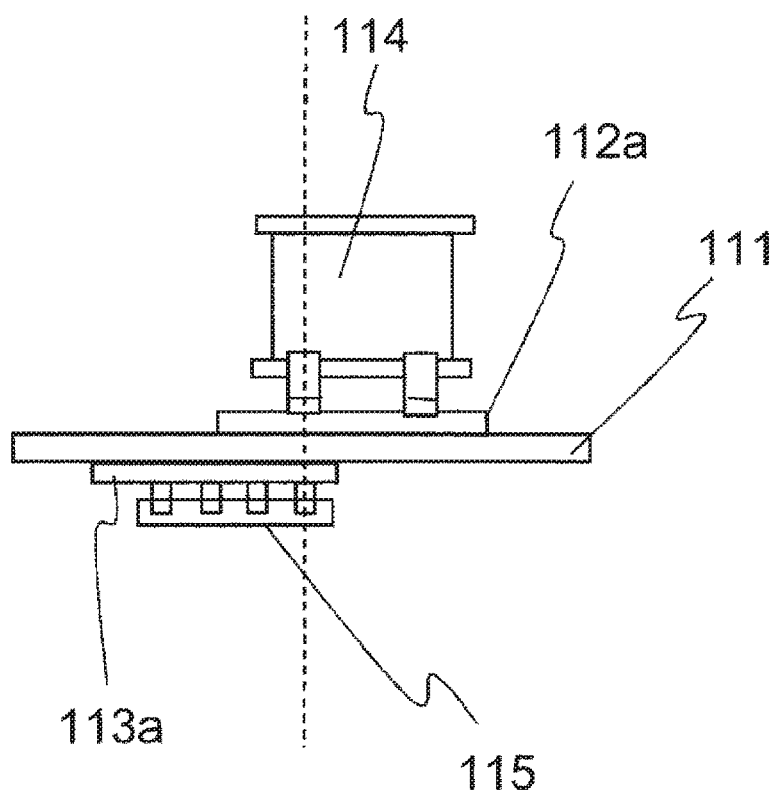
FIG. 10 is a cross-sectional view taken along line G-H of FIG. 9.

FIGS. 9 and 10 are views illustrating other exemplary arrangements. FIG. 9 is a plan view illustrating the front surface side of the driver board 101, and FIG. 10 is a cross-sectional view taken along line G-H of FIG. 9. In the example illustrated in FIGS. 9 and 10, positions of the primary side circuit 112a on the front surface side and the primary side circuit 112b on the back surface side are shifted by Δy in a direction (y direction) orthogonal to a separating direction (x direction) of the primary side circuit 112 and the secondary side circuit 113, namely a direction orthogonal to the width direction of the insulating region 120.

For example, in a case where the transformer 114 and the power supply control IC 155 are arranged to be shifted in the y direction in consideration of the arrangement of the components, the primary side circuits 112a, 112b and the secondary side circuits 113a, 113b are arranged as illustrated in FIG. 9. Even when the primary side circuits 112a, 120b on the front and back surfaces are thus arranged to be shifted in the y direction, the insulating region 120a on the front surface side and the insulating region 120b on the back surface side are arranged to face each other such that the central positions of both the regions coincide. Therefore, the insulation distance between the primary side circuit 112 and the secondary side circuit 113 is secured, and the good insulation voltage resistance performance can be maintained.

Figure 11:
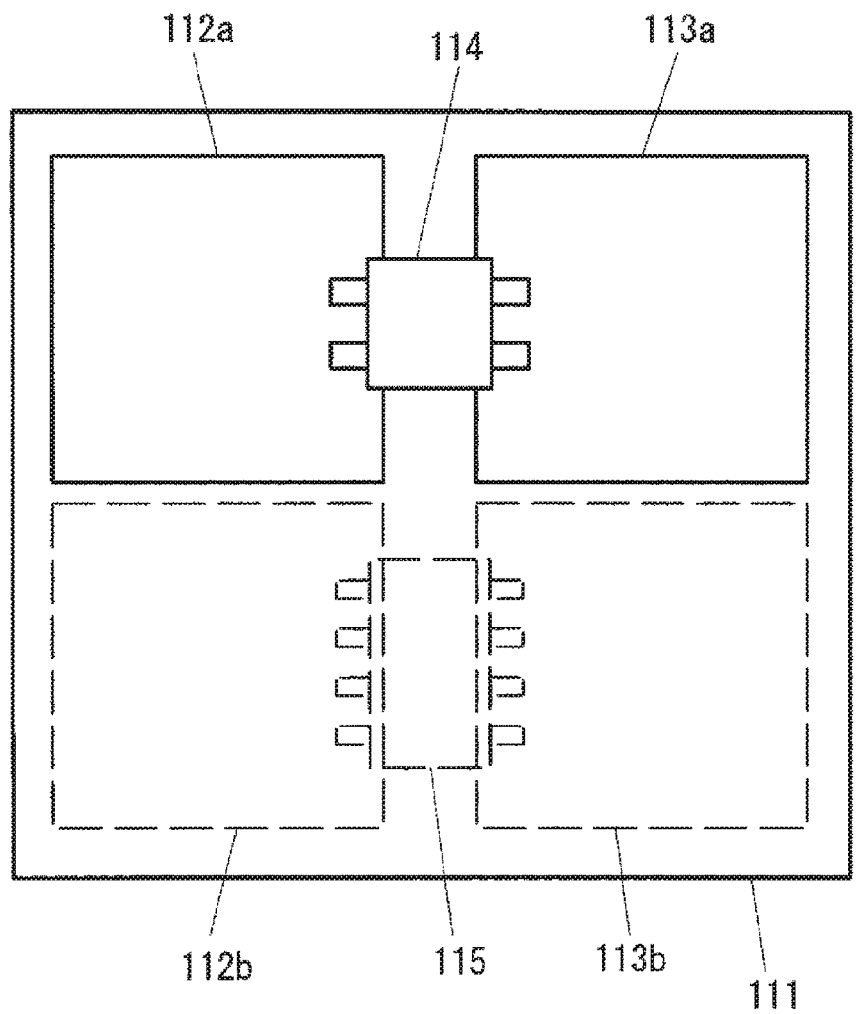
FIG. 11 is a view illustrating a comparative example.

FIG. 11 is a view illustrating a comparative example depicting a case where the primary side circuit 112a and the primary side circuit 112b do not even partially face each other and the secondary side circuit 113a and the secondary side circuit 113b do not even partially face each other. In this arrangement, the size (area) of the insulating board 111 is equal to or larger than that in a configuration to arrange all of the transformer 114, the power supply control IC 155, the primary side circuit 112, and the secondary side circuit 113 on one surface of the insulating board. In this case, the circuit components no longer need to be arranged on the back surface side.

In the example illustrated in FIG. 9, on the other hand, the primary side circuit 112a provided on one surface of the insulating board 111 and the primary side circuit 112b provided on the other surface are arranged so as to partially face each other via the insulating board 111, and the secondary side circuit 113a provided on one surface of the insulating board 111 and the secondary side circuit 113b provided on the other surface are arranged so as to partially face each other via the insulating board 111. Therefore, the area of the insulating board 111 can be smaller than that in the configuration to arrange all of the primary side circuit 112 and the secondary side circuit 113 on the one surface of the insulating board 111. As a result, the driver board 101 can be miniaturized.

Figure 12:
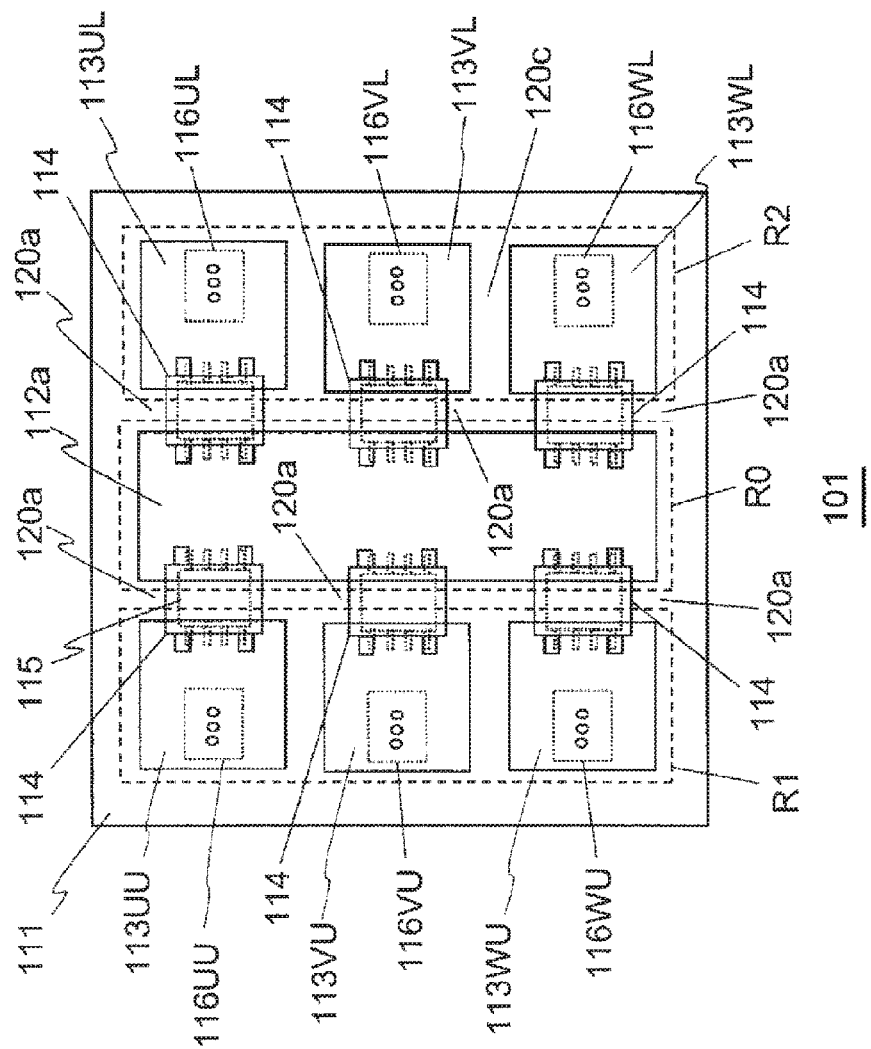
FIG. 12 is a view illustrating an exemplary arrangement of a primary side circuit and a plurality of secondary side circuits.
Figure 13:
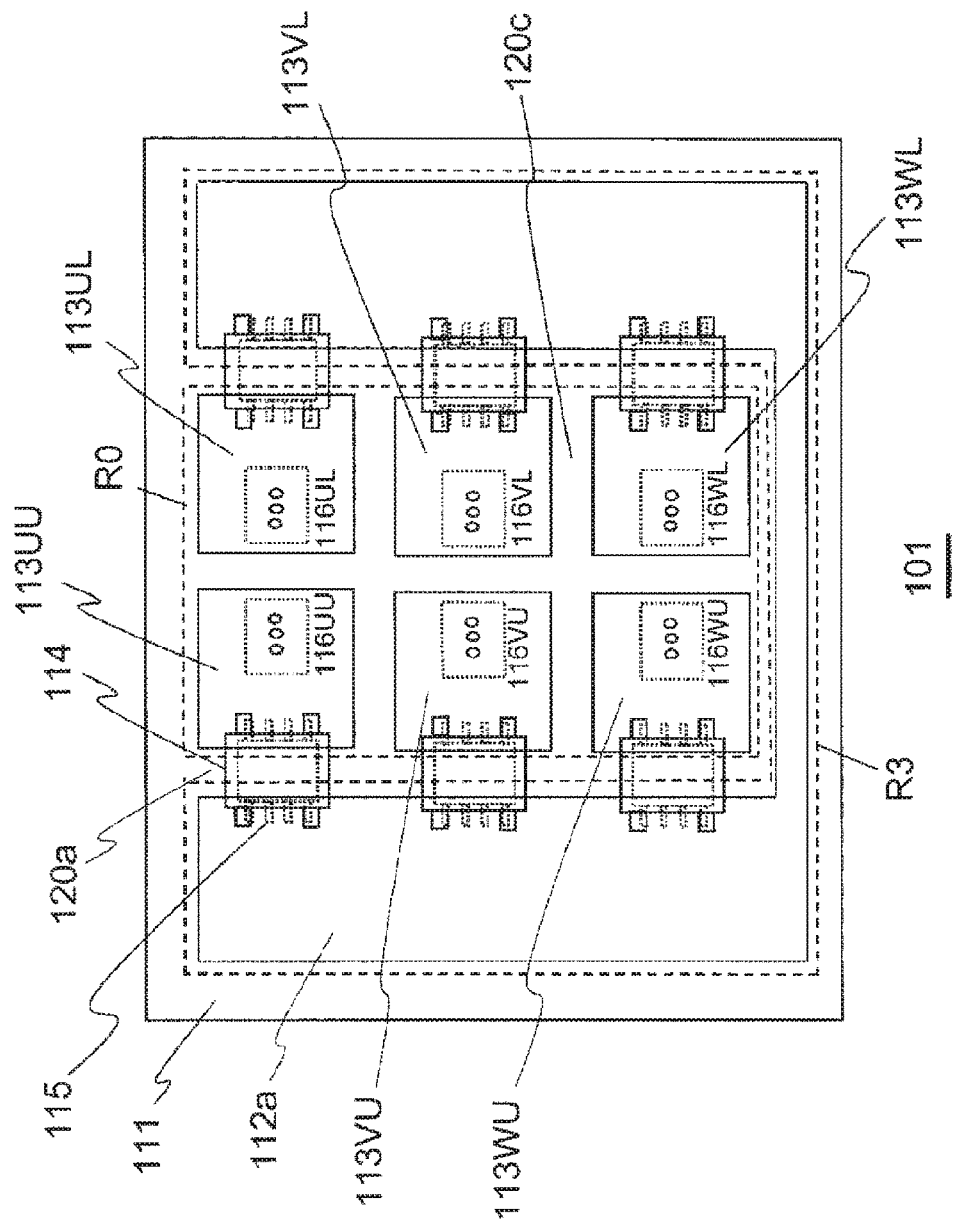
FIG. 13 is a view illustrating another exemplary arrangement of a primary side circuit and a plurality of secondary side circuits.
Figure 14:
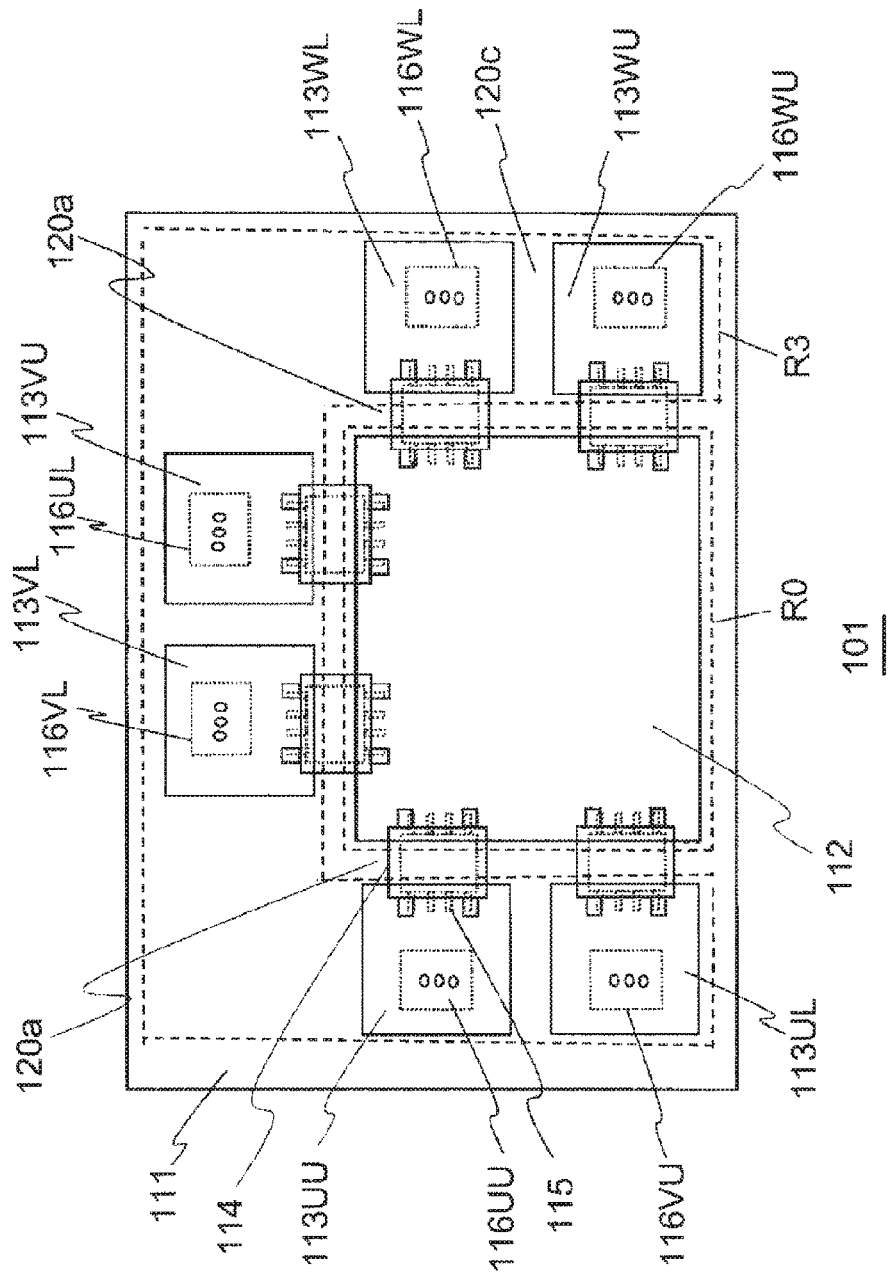
FIG. 14 is a view illustrating another exemplary arrangement of a primary side circuit and a plurality of secondary side circuits.

FIGS. 12 to 14 are views illustrating exemplary arrangements of the transformer 114, the power supply control IC 155, the primary side circuit 112, and the secondary side circuit 113 in association with the upper and lower arms constituting the U phase, the V phase, and the W phase of the inverter circuit 141. Each of FIGS. 12 to 14 is a plan view illustrating the driver board 101 as seen from the front surface side of the insulating board on which the transformer 114 is mounted.

In the example illustrated in FIG. 12, the elongated primary side circuit 112a is formed on a central part of the insulating board 111. On a left side of the primary side circuit 112a in the drawing, in order from the top, the secondary side circuit 113UU corresponding to the semiconductor switching element 116UU for the U phase upper arm, the secondary side circuit 113VU corresponding to the semiconductor switching element 116VU for the V phase upper arm, and the secondary side circuit 113WU corresponding to the semiconductor switching element 116WU for the W phase upper arm are arranged via the insulating regions 120a. On the other hand, on a right side of the primary side circuit 112a in the drawing, in order from the top, the secondary side circuit 113UL corresponding to the semiconductor switching element 116UL for the U phase lower arm, the secondary side circuit 113VL corresponding to the semiconductor switching element 116VL for the V phase lower arm, and the secondary side circuit 113WL corresponding to the semiconductor switching element 116WL for the W phase lower arm are arranged via the insulating regions 120a.

The six transformers 114 provided to correspond to the upper arms and the lower arms for the respective U phase, V phase, and W phase are provided between the primary side circuit 112a and the respective secondary side circuits 113UU to 113WL so as to cross the insulating regions 120a. Although the primary side circuit and the six secondary side circuits on the back surface side are not illustrated, the primary side circuit and the secondary side circuits formed in the same shapes as the primary side circuit 112a and the secondary side circuits 113UU to 113WL on the front surface side are arranged on the back surface side so as to face the primary side circuit 112a and the secondary side circuits 113UU to 113WL via the insulating board 111. As a result, the insulating regions 120b formed in the same shapes as the insulating regions 120a on the front surface side are arranged to face the insulating regions 120a via the insulating board 111 although they are not illustrated in the drawing. In addition, the power supply control ICs 115 are provided on the back surface side so as to cross the insulating regions 120b. As mentioned above, in the exemplary arrangement in FIG. 12, the primary side circuit 112 is arranged on the center of the driver board 101, and the plurality of secondary side circuits 113 is symmetrically arranged on the left and right regions around the primary side circuit 112.

In a case where the plurality of secondary side circuits is arranged on the one surface as illustrated in FIG. 12, the insulating regions 120a that satisfy the insulation voltage resistance performance are provided between the primary side circuit 112a and the secondary side circuits 113UU to 113WL. Furthermore, since potential differences are generated between the secondary side circuits 113UU to 113WL due to the switching operation for the semiconductor switching element 116, the insulating regions 120c corresponding to the potential differences also need to be provided between the secondary side circuits 113UU to 113WL. Regarding the primary side circuit, on the other hand, since all of the upper arms and the lower arms for the respective U phase, V phase, and W phase have the same potential, the single primary side circuit can be employed as illustrated in FIG. 12.

In the exemplary arrangement in FIG. 12, the primary side circuit 112a is arranged on a central region R0 set on the insulating board 111. The secondary side circuits 113UU, 113VU, 113WU for the upper arms are collectively arranged on a peripheral region R1 provided on the left side of the central region R0 in the drawing, and the secondary side circuits 113UL, 113VL, 113WL for the lower arms are collectively arranged on a peripheral region R2 provided on the right side of the central region R0 in the drawing. The transformers 114 and the power supply control ICs 115 are respectively arranged on the front surface side and the back surface side so as to cross the insulating regions. As a result, it is possible to miniaturize the driver board 101 while ensuring the insulation and voltage withstanding performance. For example, in such an arrangement that the region of the primary side circuit is interposed between the secondary side circuits, the distance between the secondary side circuits becomes larger, thereby causing the driver board 101 to increase in size. When the arrangement in FIG. 12 is employed, however, occurrence of this inconvenience can be avoided.

FIG. 13 is a view illustrating a second exemplary arrangement. In the second exemplary arrangement, the secondary side circuits are collectively arranged on the central region R0 of the insulating board 111, and the secondary side circuits 113UU, 113UL associated with the U phase, the secondary side circuits 113VU, 113VL associated with the V phase, and the secondary side circuits 113WU, 113WL associated with the W phase are arranged in order from the upper side in the drawing. The primary side circuit 112a is arranged on a peripheral region R3 extending over the right side, the lower side, and the left side of the central region R0 in the drawing.

In addition, in a third exemplary arrangement illustrated in FIG. 14, the primary side circuit 112a is arranged on the central region R0, and the secondary side circuits 113UU to 113WL are arranged on the peripheral region R3 around the central region R0 in contrast with the second exemplary arrangement. The exemplary arrangements illustrated in FIGS. 13 and 14 also allow the plurality of secondary side circuits 113UU to 113WL to be collectively arranged on the single region, whereby the primary side circuit is not arranged to be interposed between the secondary side circuits. Therefore, it is possible to miniaturize the driver board 101 while ensuring the insulation voltage resistance performance.

Furthermore, the power converter can be miniaturized by employing the above-mentioned configuration of the driver board 101 in the power converter including a power conversion circuit (inverter circuit 141) having the plurality of semiconductor switching elements 116 constituting the upper arms and the lower arms for the respective U phase, V phase, and W phase, and the control circuit 172 mounted on the driver board 101 to output a switching drive control command to the driver circuit 140 that drives the plurality of semiconductor switching elements 116.

The above-mentioned respective embodiments may be used individually or in combination with one another. This is because the advantageous effects of the respective embodiments can be obtained individually or synergistically. The present invention is not limited to the above-mentioned embodiments at all unless the characteristics of the present invention are deteriorated. For example, although the above-mentioned embodiments have been described using the inverter as an example, the embodiments can also be applied to a DC-DC converter or the like.

REFERENCE SIGNS LIST 10 inverter
101 driver board
111 insulating board
112, 112a, 112b primary side circuit
113, 113a, 113b secondary side circuit
114 transformer
115 power supply control IC
116, 116a, 116b, 116UU to 116WU, 116UL to 116WL semiconductor switching element
140 driver circuit
172 control circuit
701a to 701c semiconductor module

The invention claimed is:
1. A driver board on which a driver circuit that drives a switching element of a power converter is mounted, the driver board comprising:
   an insulating board formed in a flat plate shape;
   a transformer that converts an input primary side voltage to a secondary side voltage for driving the switching element;
   a power supply control IC that controls a current input to the transformer;
   a primary side circuit that is mounted on each of a first circuit region and a second circuit region and uses the primary side voltage as a power supply, the first circuit region being on one surface of the insulating board, the second circuit region being provided on another surface of the insulating board and facing the first circuit region via the insulating board;
   a secondary side circuit that is mounted on each of a third circuit region and a fourth circuit region, includes the driver circuit, and uses the secondary side voltage as a power supply, the third circuit region being adjacent to the first circuit region via a first insulating region on the one surface, the fourth circuit region being adjacent to the second circuit region via a second insulating region on the other surface;
   a first through hole that penetrates the insulating board and electrically connects the primary side circuit on the first circuit region to the primary side circuit on the second circuit region; and
   a second through hole that penetrates the insulating board and electrically connects the secondary side circuit on the third circuit region to the secondary side circuit on the fourth circuit region, wherein
   the transformer is configured, so as to cross the first insulating region, such that a primary side terminal is connected to the primary side circuit provided on the first circuit region and a secondary side terminal is connected to the secondary side circuit provided on the third circuit region,
   the power supply control IC is configured, so as to cross the second insulating region, such that a primary side terminal is connected to the primary side circuit provided on the second circuit region and a secondary side terminal is connected to the secondary side circuit provided on the fourth circuit region, and
   the first insulating region and the second insulating region are formed so as to at least partially face each other via the insulating board such that the first circuit region and the fourth circuit region do not face each other via the insulating board and the second circuit region and the third circuit region do not face each other via the insulating board.

2. The driver board according to claim 1, wherein
   the first insulating region is provided between the first circuit region and the third circuit region with a first width,
   the second insulating region is provided between the second circuit region and the fourth circuit region with a second width, and
   the first insulating region and the second insulating region are arranged such that a central position in a width direction of the first insulating region and a central position in a width direction of the second insulating region face each other via the insulating board.

3. The driver board according to claim 2, wherein
   the first circuit region provided on the one surface and the second circuit region provided on the other surface are arranged so as to partially face each other via the insulating board, and
   the third circuit region provided on the one surface and the fourth circuit region provided on the other surface are arranged so as to partially face each other via the insulating board.

4. The driver board according to claim 2, wherein
   a plurality of the switching elements, a plurality of the driver circuits, a plurality of the transformers, a plurality of the power supply control ICs, and a plurality of the secondary side circuits are provided to correspond to upper arms and lower arms for a respective U phase, V phase, and W phase of the power converter,
   a plurality of the third circuit regions and a plurality of the fourth circuit regions are separately provided to correspond to the plurality of secondary side circuits,
   each of the transformers is configured, so as to cross the first insulating region provided between the corresponding third circuit region and the first circuit region, such that the primary side terminal is connected to the primary side circuit provided on the first circuit region and the secondary side terminal is connected to the secondary side circuit provided on the corresponding third circuit region, each of the power supply control ICs is configured, so as to cross the second insulating region provided between the corresponding fourth circuit region and the second circuit region, such that the primary side terminal is connected to the primary side circuit provided on the second circuit region and the secondary side terminal is connected to the secondary side circuit provided on the corresponding fourth circuit region, and the first insulating region crossed by the transformer and the second insulating region crossed by the power supply control IC provided to correspond to the transformer face each other via the insulating board.

5. The driver board according to claim 4, wherein
the first and second circuit regions are provided on a peripheral region set on a peripheral part of the insulating board, and
the plurality of third and fourth circuit regions is provided on a central region set closer to an insulating board central side than the peripheral region.

6. The driver board according to claim 4, wherein
the plurality of third and fourth circuit regions is provided on a peripheral region set on a peripheral part of the insulating board, and
the first and second circuit regions are provided on a central region set closer to an insulating board central side than the peripheral region.

7. A power converter comprising:
the driver board according to claim 4;
a power conversion circuit having a plurality of switching elements constituting upper arms and lower arms for a respective U phase, V phase, and W phase; and
a control circuit that is mounted on the driver board and outputs a switching drive control command to the driver circuit that drives the plurality of switching elements.

8. The driver board according to claim 1, wherein
the first circuit region provided on the one surface and the second circuit region provided on the other surface are arranged so as to partially face each other via the insulating board, and
the third circuit region provided on the one surface and the fourth circuit region provided on the other surface are arranged so as to partially face each other via the insulating board.

9. The driver board according to claim 1, wherein
a plurality of the switching elements, a plurality of the driver circuits, a plurality of the transformers, a plurality of the power supply control ICs, and a plurality of the secondary side circuits are provided to correspond to upper arms and lower arms for a respective U phase, V phase, and W phase of the power converter,
a plurality of the third circuit regions and a plurality of the fourth circuit regions are separately provided to correspond to the plurality of secondary side circuits,
each of the transformers is configured, so as to cross the first insulating region provided between the corresponding third circuit region and the first circuit region, such that the primary side terminal is connected to the primary side circuit provided on the first circuit region and the secondary side terminal is connected to the secondary side circuit provided on the corresponding third circuit region,
each of the power supply control ICs is configured, so as to cross the second insulating region provided between the corresponding fourth circuit region and the second circuit region, such that the primary side terminal is connected to the primary side circuit provided on the second circuit region and the secondary side terminal is connected to the secondary side circuit provided on the corresponding fourth circuit region, and
the first insulating region crossed by the transformer and the second insulating region crossed by the power supply control IC provided to correspond to the transformer face each other via the insulating board.

10. The driver board according to claim 9, wherein
the first and second circuit regions are provided on a peripheral region set on a peripheral part of the insulating board, and
the plurality of third and fourth circuit regions is provided on a central region set closer to an insulating board central side than the peripheral region.

11. The driver board according to claim 9, wherein
the plurality of third and fourth circuit regions is provided on a peripheral region set on a peripheral part of the insulating board, and
the first and second circuit regions are provided on a central region set closer to an insulating board central side than the peripheral region.

12. A power converter comprising:
the driver board according to claim 9;
a power conversion circuit having a plurality of switching elements constituting upper arms and lower arms for a respective U phase, V phase, and W phase; and
a control circuit that is mounted on the driver board and outputs a switching drive control command to the driver circuit that drives the plurality of switching elements.

* * * * *